United States Patent
Tanaka et al.

(10) Patent No.: US 7,547,860 B2
(45) Date of Patent: Jun. 16, 2009

(54) MICROWAVE PLASMA PROCESSING APPARATUS FOR SEMICONDUCTOR ELEMENT PRODUCTION

(75) Inventors: Sumi Tanaka, Yamanashi (JP); Jun Yamashita, Amagasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 10/886,572

(22) Filed: Jul. 9, 2004

(65) Prior Publication Data

US 2005/0051520 A1 Mar. 10, 2005

Related U.S. Application Data

(63) Continuation-in-part of application No. PCT/JP03/00159, filed on Jan. 10, 2003.

(30) Foreign Application Priority Data

Jan. 10, 2002 (JP) ............................... 2002-003191

(51) Int. Cl.
- C23F 1/00 (2006.01)
- H01L 21/306 (2006.01)
- C23C 16/00 (2006.01)
- B23K 10/00 (2006.01)

(52) U.S. Cl. ........................ 219/121.43; 156/345.51; 118/728; 118/723 MW

(58) Field of Classification Search ............ 204/298.01–298.41; 156/345; 315/111; 216/67; 219/121.36–121.6; 313/231.31–231.61; 118/723 MW, 728

See application file for complete search history.

(56) References Cited

U.S. PATENT DOCUMENTS

| | | | | |
|---|---|---|---|---|
| 5,034,086 A | * | 7/1991 | Sato | 156/345.42 |
| 5,695,568 A | * | 12/1997 | Sinha et al. | 118/729 |
| 5,919,332 A | * | 7/1999 | Koshiishi et al. | 156/345.47 |
| 5,951,776 A | * | 9/1999 | Selyutin et al. | 118/729 |
| 6,120,609 A | * | 9/2000 | Selyutin et al. | 118/728 |
| 6,213,478 B1 | * | 4/2001 | Nishikawa | 279/4.08 |
| 6,402,848 B1 | * | 6/2002 | Horiguchi et al. | 118/715 |
| 6,511,575 B1 | * | 1/2003 | Shindo et al. | 204/298.34 |
| 7,033,444 B1 | * | 4/2006 | Komino et al. | 118/725 |
| 2001/0054385 A1 | * | 12/2001 | Horiguchi | 118/723 R |

(Continued)

FOREIGN PATENT DOCUMENTS

EP 1 108 801 6/2001

(Continued)

*Primary Examiner*—Tu B Hoang
*Assistant Examiner*—Stephen J Ralis
(74) *Attorney, Agent, or Firm*—Finnegan, Henderson, Farabow, Garrett & Dunner, L.L.P.

(57) ABSTRACT

A plasma processing apparatus 100 used to execute a specific type of processing such as plasma processing on a workpiece by supplying a processing gas into a chamber 110 while applying high-frequency power to generate plasma includes a stage 108 on which the workpiece is placed and a stage supporting unit 124 that holds the stage 108. Bellows 120 and 122 are disposed above and below the stage supporting unit 124 to support the stage 108 in a horizontal state relative to the chamber 110. Thus, a plasma processing apparatus that does not allow the workpiece stage to become tilted, affords ease of maintenance and is capable of stable processing is provided. In addition, the internal spaces at the bellows 120 and 122 are used as an exhausting pipe to achieve efficient and uniform exhaustion of the chamber 110.

11 Claims, 6 Drawing Sheets

U.S. PATENT DOCUMENTS

2004/0035530 A1 * 2/2004 Ilzuka .................. 156/345.29

FOREIGN PATENT DOCUMENTS

| JP | 4-154116 | 5/1992 |
| JP | 6-333879 | 12/1994 |
| JP | 9-31656 | 2/1997 |
| JP | 9-45497 | 2/1997 |
| JP | 2001-257202 A | 9/2001 |
| WO | WO 0079019 A1 * | 12/2000 |

* cited by examiner

MICROWAVE PLASMA PROCESSING APPARATUS FOR SEMICONDUCTOR ELEMENT PRODUCTION

CROSS-REFERENCE TO RELATED APPLICATIONS

This application is a continuation-in-part of International Application PCT/JP03/00159, filed on Jan. 10, 2003, which was not published under PCT Article 21(2) in English. The contents of that International Application are incorporated herein by reference in its entirety.

FIELD OF THE INVENTION

The present invention relates to a processing apparatus that executes a specific type of processing on a workpiece, and more specifically, it relates to a processing apparatus having a stage on which the workpiece is placed.

DESCRIPTION OF RELATED ART

Processing apparatuses of this type include microwave plasma processing apparatuses that may be utilized in, for instance, semiconductor element production. A microwave plasma processing apparatus adopts a structure that allows the stage to move up/down freely, since an antenna (electrode) and the workpiece stage are set over different distances from each other at the time of plasma ignition and during the process or the distance needs to be varied depending upon the processing conditions.

FIG. 6 is a schematic sectional view showing the structure adopted in a plasma processing apparatus 1 in the related art. As shown in FIG. 6, the plasma processing apparatus 1 includes a substantially cylindrical chamber 10 with an open top. The chamber 10 is constituted with a conductive material such as aluminum or stainless steel.

At the open top of the chamber 10, a flat dielectric plate 4 is horizontally disposed. The dielectric plate 4 may be constituted of quartz or ceramic and has a thickness of, for instance, approximately 20 to 30 mm. A seal member (not shown) which may be an O-ring is disposed between the chamber 10 and the dielectric plate 4 to maintain an airtight condition.

A radial line slot antenna unit 55 which is a type of slot antenna, for instance, is disposed above the dielectric plate 4. The radial line slot antenna unit 55 is connected to a microwave generator (not shown) via a coaxial line, a rectangular coaxial converter and a rectangular wave guiding channel (not shown). The microwave generator generates a microwave with a frequency within a range of 300 MHz to 30 GHz, e.g., 2.45 GHz. In addition, a matching circuit (not shown) that executes impedance matching may be provided in the rectangular wave guiding channel to improve the efficiency of power use.

The microwave generator is connected at the center of the upper surface of the radial line slot antenna unit, a microwave electromagnetic field is induced inside the microwave guiding channel (not shown) and the microwave electromagnetic field is radiated into the chamber 10 from a conductor plate (not shown) constituting the lower surface of the radial line slot antenna unit 55 via the dielectric plate 4.

At the bottom of the chamber 10, a rotary pump (not shown), a turbo pump (not shown) or the like is disposed so as to achieve the desired degree of vacuum inside the chamber 10. In addition, at the sidewall of the chamber 10, a gas injector 6 through which various types of processing gases and the like are supplied is provided.

Inside the chamber 10, a stage 8 on which a workpiece such as a semiconductor wafer W is placed is disposed in such a manner that it is allowed to move up/down. A heating resistor (not shown) is embedded in the stage 8 so as to heat the wafer W by applying power to the heater and thus heating the stage 8. The stage 8 is constituted of a ceramic such as AlN or $Al_2O_3$.

At the bottom edge of the stage 8, three lifter pins 14, for instance, which are allowed to move up/down by a wafer pin drive unit (not shown) are disposed. The lifter pins 14 move downward when the wafer W is to be placed on the stage 8, whereas they move upward before a transfer so as to facilitate the movement of the wafer W. It is to be noted that an annular baffle plate 50 is disposed around the stage 8. The baffle plate 50 is fixed to a stage supporting unit 24 to be detailed later via a baffle plate support rod 52. As the stage supporting unit 24 moves up/down, the baffle plate 50, too, moves up/down together with the stage 8.

The stage 8 is supported by the stage supporting unit 24 via a support element 16. The stage supporting unit 24 is connected to the bottom of the chamber 10 via a guide 36 and a guide rail 38. More specifically, the guide rail 38 is formed to pass through the bottom of the chamber 10 at the bottom of the stage supporting unit 24 near an edge. At the bottom of the chamber 10, the guide 36 is disposed to guide the vertical movement of the guide rail 38. The guide 36 is fixed onto the bottom of the chamber 10 with a support member 34. At the upper end of the guide 36 and the bottom of the stage supporting unit 24, a bellows 20 which enclose the guide rail 38 is disposed so as to sustain the stage supporting unit 24 with an airtight seal.

As the stage supporting unit 24 is caused to move up/down via the guide 36 and the guide rail 38, the stage 8 supported at the stage supporting unit 24, too, moves by interlocking with the movement of the stage supporting unit 24. As the stage supporting unit 24 moves up/down, the bellows 20 expands/contracts. Thus, the bellows 20 supports the stage 8 via the stage supporting unit 24, together with the guide 36 and the guide rail 38. The stage 8 is supported with the stage supporting unit 24 disposed under the stage 8 and a vacuum state is sustained in the plasma processing apparatus when the structure described above is adopted.

However, this plasma processing apparatus 1 adopts a cantilever structure in which the stage supporting unit 24 is by the bellows 20, the guide 36 and the guide rail 38 all disposed under the stage supporting unit 24 near the edge offset from the center.

For this reason, if even the slightest tilt occurs at the bellows 20, the guide 36 or the guide rail 38, the stage 8, which is supported via the stage supporting unit 24 becomes tilted to a significant degree. In addition, there is a problem in that a vibration tends to occur readily during operation.

There is another problem in that when a vacuum state is achieved inside the plasma processing apparatus 1, the vertical drive unit, which supports stage 8 and also causes a vertical movement of the stage 8, becomes tilted due to pressure of the external atmospheric pressure, thermal distortion of the stage 8 or the weight of the stage 8, resulting in a tilt of the stage 8. This necessitates frequent horizontal adjustment of the stage 8 and frequent alignment of the lifter pins 14, which makes it difficult to execute uniform processing on workpieces.

SUMMARY OF THE INVENTION

An object of the present invention, which has been completed by addressing the problems discussed above, is to provide a new and improved processing apparatus in which the stage does not become tilted even when a vacuum state is achieved inside the processing apparatus.

In order to achieve the object described above, an aspect of the present invention provides a processing apparatus used to execute a specific type of processing on a workpiece inside a processing container, comprising a stage on which the workpiece is placed, a stage supporting unit that supports the stage and is supported at the processing container so as to be allowed to move up/down freely, horizontal holding members each disposed above and/or below the stage supporting unit to hold the stage in a horizontal state, hollow portions each formed inside one of the horizontal holding members and communicating with an exhausting hole formed at the processing container, and a communicating hole formed in the stage supporting unit to communicate between the hollow portions in the individual horizontal holding members. Wherein the processing container is exhausted via the hollow portions in the horizontal holding members and the communicating hole in the stage supporting unit.

In the processing apparatus adopting the structure described above, uniform processing can be executed on workpieces since the stage on which the workpieces are placed are not allowed to become tilted even when a vacuum state is achieved inside the processing apparatus by disposing the horizontal holding members such as bellows above and below the stage supporting unit. In addition, maintenance work on the processing apparatus can be conducted with greater ease since the horizontal adjustment of the stage, the positional adjustment of the lifter pins and the like do not need to be performed frequently.

Furthermore, the stage supporting unit may be supported in a horizontal state at the processing container via, for instance, a stage drive mechanism, a slide support mechanism and the like that allow the stage supporting unit to move up/down freely and the stage may be held in a horizontal state with the horizontal holding members such as bellows in a stable manner. Also, by forming the communicating hole in the stage supporting unit so as to communicate between the hollow portions in the individual horizontal holding members, the horizontal holding members can be utilized as an exhausting pipe as well. Since the processing container can be exhausted through the hollow portions in the horizontal holding members and the communicating hole in the stage supporting unit, the processing container can be exhausted efficiently and uniformly.

In order to achieve the object described above, another aspect of the resident invention provides a processing apparatus used to execute a specific type of processing on a workpiece inside a processing container, comprising a stage on which the workpiece is placed, a stage supporting unit that supports the stage, a flange pipe disposed under the processing container, through which the processing container is exhausted, and fixing portions disposed at at least two positions to fix the stage supporting unit to the inner side surface of the flange pipe.

In the processing apparatus adopting the structure described above, the stage is fixed to the processing container at at least two positions and thus, the stage is held horizontally even when the processing container is in a vacuum state inside to enable uniform processing on the workpiece. In addition, maintenance work on the processing apparatus can be conducted with greater ease since the positional adjustment of the lifter pins and the like do not need to be performed frequently.

Moreover, since the stage supporting unit is fixed at at least two positions, the stage can be held in a horizontal state in a stable manner. In addition, as the stage supporting unit is fixed at the inner side surface of the flange pipe through which the processing container is exhausted, the processing container can be exhausted uniformly with a higher degree of efficiency.

DETAILED DESCRIPTION OF THE INVENTION

Figure 1:
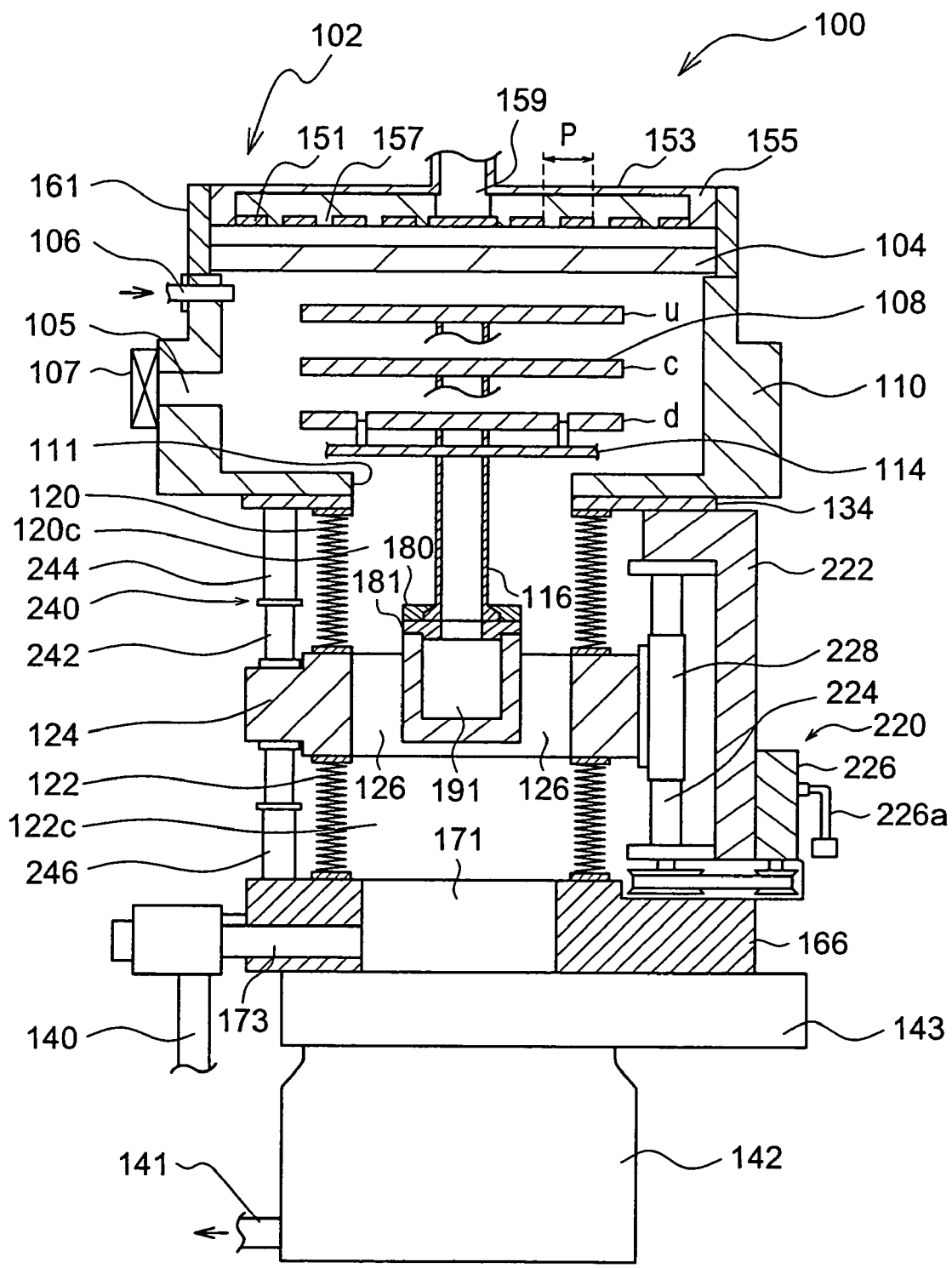
FIG. 1 is a schematic sectional view showing the structure adopted in the plasma processing apparatus achieved in a first embodiment of the present invention.

The following is a detailed explanation of the preferred embodiments of the plasma processing apparatus according to the present invention, given in reference to the attached drawings. It is to be noted that in the description and the drawings, the same reference numerals are assigned to components having substantially identical functions and structural features to preclude the necessity for a repeated explanation thereof.

FIRST EMBODIMENT

FIG. 1 is a schematic sectional view of the structure adopted in a plasma processing apparatus 100 in the first embodiment of the present invention. As shown in FIG. 1, the plasma processing apparatus 100 includes a chamber 110. The chamber 110, which is a cylindrical processing container with an open upper portion, is constituted with a conductive material, e.g., a metal such as aluminum or stainless steel, or an alloy thereof.

At the open upper portion of the chamber 110, a flat dielectric plate 104 is horizontally disposed. The dielectric plate 104 may be constituted of quartz, a ceramic such as AlN or $Al_2O_3$, or sapphire and has a thickness of, for instance, approximately 20 to 30 mm. A seal member (not shown) which may be an O-ring is disposed between the chamber 110 and the dielectric plate 104 to maintain an airtight condition.

Above the dielectric plate 104, a radial antenna unit 102, which is a type of slot antenna, is installed. The radial antenna unit 102 includes a radial line slot antenna constituted with a first conductor plate (lower conductor plate) 151 forming a radial surface, a second conductor plate (upper conductor plate) 153 disposed above the conductor plate 151 so as to face opposite the conductor plate 151, and a ring member 155 that connects the outer edges of the conductor plates 151 and 153 to shield the area between the conductor plates 151 and 153.

The radial antenna unit 102 is connected to a microwave generator (not shown) via a coaxial line, a rectangular coaxial converter and a rectangular wave guiding channel. The microwave generator generates a microwave with a frequency within a range of 300 MHz to 30 GHz, e.g., 2.45 GHz and the microwave thus generated is guided into a microwave guiding channel 159. In addition, a matching circuit (not shown) that executes impedance matching may be provided in the rectangular wave guiding channel to improve the efficiency of power use.

The microwave generator is connected to the center of the conductor plate 153 constituting the upper surface of the radial antenna unit 102, and the electromagnetic field of the microwave is induced into the conductor plate 151 via the microwave guiding channel 159.

The conductor plate 151 constituting the lower surface of the radial antenna unit 102 is disposed to extend parallel to the dielectric plate 104. Numerous slots 157 are formed at the conductor plate 151 in concentric circles with, for instance, a pitch P along the radial direction. The radii of the concentric circles increase in an arithmetic sequence. The pitch P is set so that the electromagnetic field is radiated on an angle relative to the direction along which the normal line of the conductor plate 151 extends, i.e., along the vertical direction. In the processing apparatus adopting the structure described above, the microwave electromagnetic field is radiated into the chamber 110 from the conductor plate 151 via the dielectric plate 104.

When the wavelength of the electromagnetic field being propagated through the microwave guiding channel 159 (hereafter referred to as an in-pipe wavelength) is $\lambda g$, the distance between the two conductor plates 151 and 153 is set to a value smaller than $\lambda g/2$. For instance, when the microwave has a high frequency of 2.45 GHz and the dielectric constant $\in_v$ inside the microwave guiding channel 159 is 1, the distance between the two conductor plates 151 and 153 is set smaller than 6 cm. By setting the distance to a value smaller than $\lambda g/2$, formation of any standing wave is prevented from occurring between the conductor plates 151 and 153. However, it is desirable to ensure that the distance is equal to or greater than $0.5/(\in_v)^{1/2}$ cm in order to prevent the discharge from occurring between the conductor plates 151 and 153.

The conductor plates 151 and 153 and the ring member 155 are constituted of a conductor such as copper, aluminum, SUS, nickel, an alloy containing such metals, or the like. It is to be noted that a dielectric member (with a dielectric constant larger than 1) such as ceramic may be disposed between the conductor plates 151 and 153, i.e., inside the microwave guiding channel 159. In addition, the conductor plate 151 of the radial line slot antenna, which is isolated and is thus protected from the chamber 110 by the dielectric plate 104, is not exposed to plasma.

A cylindrical shield member 161 covers the dielectric plate 104 and the radial antenna unit 102. The shield member 161 may be constituted of a metal such as aluminum, SUS, nickel, copper or an alloy thereof. The electromagnetic field radiated from the radial antenna unit 102 is blocked by this shield member 161 and thus is not allowed to leak to the outside of the plasma processing apparatus 100.

An exhausting hole is formed at an approximate center at the bottom of the chamber 110, and the chamber 110 is exhausted through this hole, and through a hollow portion 120c in an upper bellows 120, a communicating hole 126 at a stage supporting unit 124 and a hollow portion 122c in a lower bellows 122, to be detailed later toward a lower exhaustion flange 166 disposed further downward.

An exhaust hole 171 with a relatively large diameter which passes through the lower exhaustion flange 166 along the vertical direction is formed at the lower exhaustion flange 166. A turbo pump 142 is connected at the bottom of the lower exhaustion flange 166 via a valve 143. The valve 143 is constituted with, for instance, a shutoff valve (high-back valve) and a pressure control valve such as an APC (Auto Pressure Controller) valve.

A rough suction exhaustion passage 173 with a relatively small diameter, which communicates with the exhaust hole 171 is disposed to extend along, for instance, the horizontal direction at the lower exhaustion flange 166. This rough suction exhaustion passage 173 is connected with a rough suction line 140 via an electromagnetic valve, and a vacuum pump (not shown) is connected to the rough suction line 140.

When exhausting the chamber 110, the valve 143 is closed and the electromagnetic valve is opened so as to suck roughly the chamber 110 with a rotary pump (not shown) from the exhaust hole 171 via the rough suction exhaustion passage 173 and the rough suction line 140 until a predetermined degree of vacuum is achieved. Then, the electromagnetic valve 139 is closed and the valve 143 is opened so as to exhaust the chamber 110 with the turbo pump 142 connected to the exhaust hole 171 through an exhausting outlet 141. As a result, a desired degree of vacuum is achieved inside the chamber 110.

At the sidewall of the chamber 110, a gas injector 106 through which various types of processing gases and the like are supplied is disposed at a position higher than the surface of a stage 108 on which a workpiece is placed. The gas injector 106 may adopt a structure that includes, for instance, an annular nozzle portion with a plurality of holes formed therein so as to supply a processing gas through the plurality of holes. It is to be noted that the gas injector may be constituted by disposing a plurality of nozzles uniformly inside the chamber 110 or it may assume a shower head structure.

The stage 108 is provided inside the chamber 110. The stage 108, on which a workpiece such as a semiconductor wafer (not shown) is placed, adopts a structure that allows it to move up/down. At the upper surface (stage surface) of the stage 108, an indented portion with a depth of, for instance, approximately 0.5 to 1 mm is formed so as to range slightly further outward relative to the periphery of the semiconductor wafer, and the semiconductor wafer placed inside the indented portion is not allowed to shift.

It is to be noted that an electrostatic chuck may be provided at the stage surface of the stage 108, instead. In this case, the semiconductor wafer is electrostatically attracted to and held by the electrostatic chuck, and thus, the semiconductor wafer can be held in place without having to form an indented portion at the stage surface of the stage 108.

A heating resistor (not shown) is embedded in the stage 108. The stage 108 is heated and ultimately the wafer is heated by applying power from a source (not shown) to the heating resistor via a wiring 177. In addition, a temperature measuring member (not shown) such as a thermocouple connected to a wiring 175 is provided. The temperature measuring member monitors the temperature of the stage 108, and based upon the measurement value obtained by the temperature measuring member, the temperature of the semiconductor wafer is controlled by heating the semiconductor wafer uniformly. The stage 108 is constituted of a ceramic such as AlN or $Al_2O_3$. Among the materials that may be used to constitute the stage 108, AlN is particularly desirable because of its outstanding heat conduction characteristics.

A lower electrode is embedded inside the stage 108 toward the front surface. It is to be noted that a high-frequency source (not shown) may be connected to the lower electrode via a matching box (not shown). In such a case, the high-frequency source may apply high-frequency power in, for instance, a range of 450 kHz to 13.65 MHz so as to apply a high-frequency bias, or a DC source may be connected so as to apply a continuous bias.

A mechanism that holds the stage 108 so as to allow the stage 108 to move up/down is disposed toward the bottom of the chamber 110. At the lower surface under the bottom of the chamber 110, an upper flange 134 having a hole with a diameter substantially equal to the diameter of the hole at the bottom of the chamber 110 is disposed. A stage supporting unit 124 that supports the stage 108 is held between the upper flange 134 and the lower exhaustion flange 166 so as to be allowed to move up/down.

The stage supporting unit 124 supports the stage 108 via a stage support element 116. The stage supporting unit 124 is constituted of a mental such as Al, whereas the stage support element 116 is constituted of a ceramic such as AlN. The stage supporting unit 124 is mounted between the upper flange 134 and the lower exhaustion flange 166 so that it is supported by a slide support mechanism 240 and a stage drive mechanism 220, which also cause it to move up/down. The stage 108 moves up/down by interlocking with the vertical movement of the stage supporting unit 124.

The upper bellows 120 is disposed so as to be allowed to extend/contract freely between the upper flange 134 and the stage supporting unit 124. The upper end of the upper bellows 120 is connected to the lower surface of the upper flange 134, whereas the lower end of the upper bellows 120 is connected to the upper surface of the stage supporting unit 124. The lower bellows 122 is disposed so as to be allowed to expand/contract freely between the stage supporting unit 124 and the lower exhaustion flange 166. The upper end of the lower bellows 122 is connected to the lower surface of the stage supporting unit 124, whereas the lower end of the lower bellows 122 is connected to the upper surface of the lower exhaustion flange 166.

Figure 2:
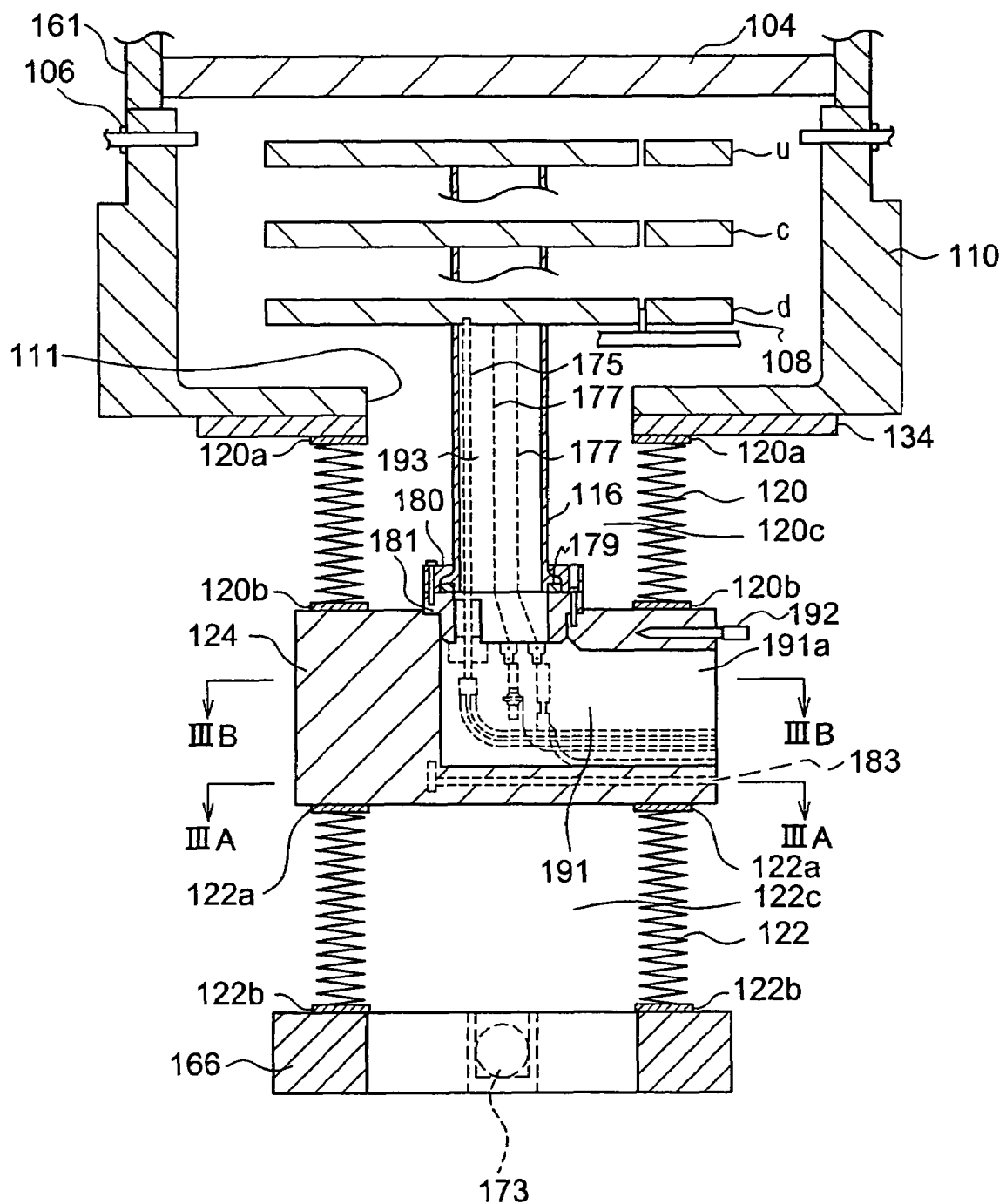
FIG. 2 is a sectional view of the support element and the stage supporting unit.
Figure 3A:
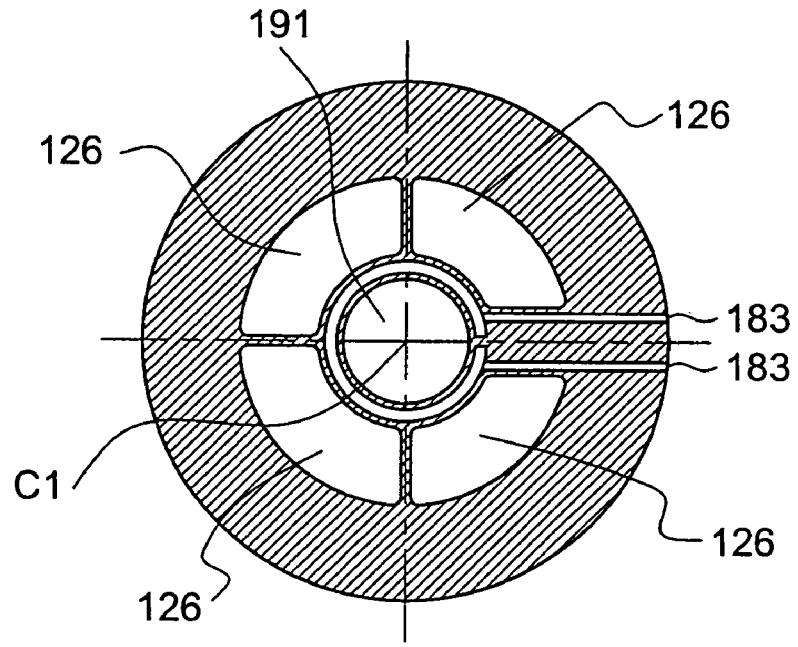
FIG. 3 presents sectional views of the stage supporting unit in FIG. 2, with FIG. 3A presenting a sectional view taken along IIIA-IIIA and FIG. 3B presenting a sectional view taken along IIIB-IIIB.
Figure 3B:
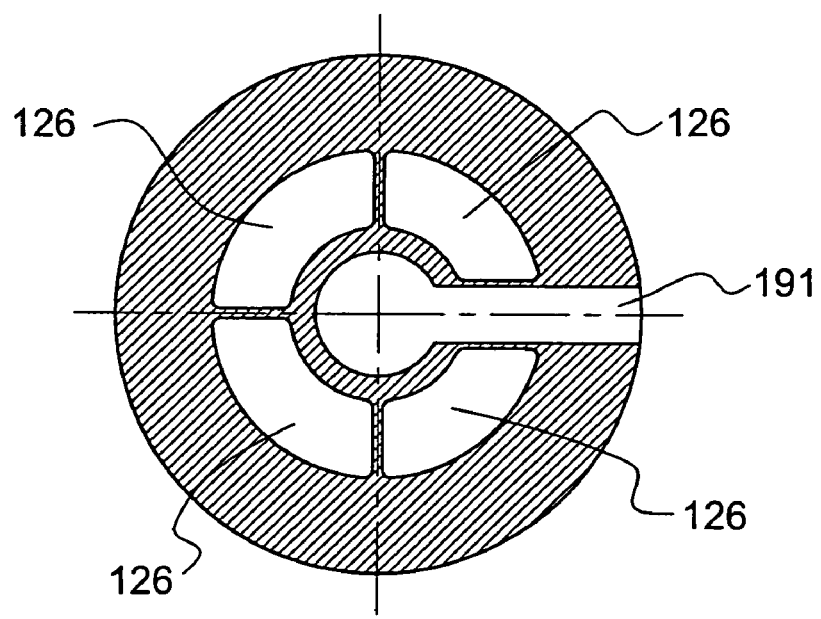

Now, the structure of the stage supporting unit 124 is explained in detail in reference to FIGS. 1, 2 and 3. FIG. 2 is a sectional view of a space 191 in the stage supporting unit 124 taken along its opening. FIG. 3A is a sectional view taken along IIIA-IIIA in FIG. 2 and FIG. 3B is a sectional view taken along IIIB-IIIB in FIG. 2.

As shown in FIG. 1, the bellows 120 and 122 constituting the horizontal holding members capable of holding the stage 108 in a horizontal state (horizontal retaining members used to sustain the stage 108 in a horizontal state), which characterize the present invention, are disposed above and below the stage supporting unit 124 with an airtight seal. The bellows 120 and 122 are to be described in detail later. A plurality of communicating holes (exhausting holes) 126 communicating between the hollow portion 120c (exhausting passage) in the upper bellows 120 and the hollow portion 122c (exhausting passage) in the lower bellows 122 are formed in the stage supporting unit 124. The hollow portion 120c at the upper bellows 120 communicates with the space inside the chamber 110 (processing space), whereas the hollow portion 122c at the lower bellows 122 communicates with the exhaust hole 171 formed at the lower exhausting flange 166. The hollow portion 120c and the hollow portion 122c formed as described above at the upper bellows 120 and the lower bellows 122 both constitute an exhausting passage through which the atmosphere inside the chamber 110 is guided to the lower exhaustion flange 166. In addition, the exhaust hole 171 at the lower exhaustion flange 166 communicates the chamber 110 with the rough suction line 140 and the turbo pump 142.

Since the space inside the chamber 110 is uniformly exhausted through the exhausting hole 111 formed at an approximate center at the bottom of the chamber 110, as described above, the exhausted atmosphere reaches the exhaust hole 171 on the lower side via the hollow portion 120c in the upper bellows 120, the communicating holes 126 in the stage supporting unit 124 and the hollow portion 122c in the lower bellows 122. Thus, the chamber 110 can be uniformly exhausted through the exhaust hole 171.

The exhausting holes (communicating holes) 126 at the stage supporting unit 124 are formed by uniformly partitioning an opening as shown in FIGS. 3A and 3B, for instance. The exhausting holes 126 are formed so as to substantially achieve point symmetry with respect to one another relative to a center C1 of the stage supporting unit 124, and thus, it is ensured that the processing chamber is exhausted evenly and that the pressure is applied uniformly to the stage supporting unit 124.

As described above, in the embodiment, the hollow portions 120c and 122c in the bellows 120 and 122 constituting the horizontal holding members are used as an exhausting passage, and the bellows 120 and 122 are made to communicate with each other through the communicating holes 126 formed with substantially uniform intervals at the stage supporting unit 124 as explained above. As a result, the exhausting hole 111 formed at an approximate center at the bottom of the chamber 110 can be communicated with the exhaust hole 171 in a desirable manner through the stage supporting unit 124, and the atmosphere in the chamber 110 can be suctioned evenly with a high degree of efficiency through the exhaust hole 171.

In addition, the space 191 opening from the center toward a side is formed at the stage supporting unit 124. This space 191 communicates with the atmosphere via an opening 191a. The space 191 communicates with a space 193 in the stage support element 116, and the spaces 191 and 193 are both open to the atmosphere.

In the space at the stage supporting unit 124, the wiring 177 through which power is supplied to the heating resistor (not shown) in the stage 108 is supplied, the wiring 175 of the thermocouple used to measure and control the temperature of the stage 108 and the like are disposed. The wiring 177, the wiring 175 of the thermocouple and the like are led out to the outside of the plasma processing apparatus 100 through the atmosphere-side space 191 via the space 193 inside the stage support element 116 and the space inside the stage supporting unit 124, and thus, maintenance work on them is facilitated.

Inside the stage supporting unit 124 near its bottom, a cooling water passage 183 is formed as shown in FIGS. 2 and 3A, and thus, cooling water can be supplied from the outside of the plasma processing apparatus 100. This cooling water passage 183 may be constituted with, for instance, a water supply passage and a draining passage both extending substantially linearly from one side of the stage supporting unit 124 toward the center and an annular passage communicating with the water supply passage and the draining passage and formed on a circle concentric with the center C1 described earlier so as to enclose the central area of the space 191. The cooling water flowing through this cooling water passage 183 prevents an increase in the temperature of the stage supporting unit 124 caused by the heat of the stage 108 which would otherwise be transferred via the stage support element 116.

As the stage 108 and the stage support element 116 are formed as an integrated unit or are bonded to each other through brazing or the like, the structure does not require any vacuum seal or fixing screw. The stage 108 and the stage support element 116 are formed by using a same material such as AlN. The lower portion of the stage support element 116 is fixed onto the upper side of a insulation supporting portion 181 constituted of an adiabatic material such as a ceramic e.g., $Al_2O_3$ or an insulating material, with a screw or the like via a fixing ring 180 constituted of a metal such as Al or an alloy, and thus, the extent of heat transfer from the stage support element 116 to the stage supporting unit 124 is reduced. An O-ring 179 or the like is used to seal the stage support element 116 and the insulation supporting portion 181 with an airtight seal. In addition, the insulation supporting portion 181 is fixed onto the stage supporting unit 124 with an airtight seal by using an O-ring or the like.

The bellows connected to the stage supporting unit 124 with an airtight seal include, for instance, the upper bellows 120 disposed above the stage supporting unit 124 and the lower bellows 122 disposed under the stage supporting unit 124. The upper bellows 120 and the lower bellows 122 are each formed in a substantially cylindrical shape with accordion folds so as to expand and contract freely. After the pressure inside the chamber 110 is reduced to achieve a vacuum state, the force that would cause the stage 108 to tilt is absorbed by the upper and lower bellows 120 and 122 and thus, the stage 108 is held horizontally.

The upper portion of the upper bellows 120 is connected to the edge on the lower side of the hole formed at the upper flange 134 via a flange portion 120a. The lower portion of the upper bellows 120 is connected to the upper portion of the stage supporting unit 124 via a flange portion 120b. The upper portion of the lower bellows 122 is connected to the lower portion of the stage supporting unit 124 via a flange portion 122a, whereas the lower portion of the lower bellows 122 is connected to the upper portion of the lower exhaustion flange 166 via a flange portion 122b.

By disposing the stage supporting unit 124 between the upper flange 134 and the lower exhaustion flange 166 via the bellows 120 and 122 as described above, the stage 108 can be held horizontally in a stable manner via the stage supporting unit 124. It is to be noted that the horizontal holding members do not need to be constituted with the bellows as long as the stage 108 can be held horizontal with the horizontal holding members. The horizontal holding members constituted with the bellows 120 and 122 used in the embodiment are particularly advantageous in an application with the movable stage 108 since they can expand/contract as the stage 108 moves.

A lifter drive mechanism (not shown) which moves the lifter pins 114 shown in FIG. 1 up/down is disposed inside the chamber 110. When placing a semiconductor wafer onto the stage 108, the lifter pins 114 are lowered by the lifter drive mechanism so as to lower the semiconductor wafer onto the stage 108, whereas they are raised by the lifter drive mechanism when the semiconductor wafer is to be carried out of the chamber so as to lift the semiconductor wafer from the stage 108. The semiconductor wafer is carried into or out of the chamber 110 via a wafer transfer port 105 and a gate valve 107 shown in FIG. 1.

Next, the sequence with which an etching process is executed with the plasma processing apparatus 100 in the embodiment is explained. First, the workpiece is carried into the chamber to a position above the stage 108 set at a position d, the lifter pins 114 are lowered by the lifter drive mechanism (not shown), and the workpiece having been carried in through the workpiece transfer port (not shown) is placed onto the stage 108. Then, the electrostatic chuck is turned on and the workpiece is held onto the stage. In addition, the insulation supporting portion 181 is fixed onto the stage supporting unit 124 with their tightness by using an O-ring or the like. At this time, the temperature of the workpiece is controlled so that it remains within a range of, for instance, −20° C. to 20° C. It is to be noted that high-frequency power may be applied to the stage to apply a bias.

Next, the plasma processing apparatus 100 is exhausted first through the rough suction line 140. Once a specific degree of vacuum is achieved, the turbo pump 142 is used to exhaust the chamber 110 to a predetermined degree of vacuum, e.g. 1 to 133.3 Pa. While holding this degree of vacuum, a plasma gas such as Ar, $CF_4$, or $C_4F_8$ and a processing gas are supplied through the gas injector 106 by controlling their flow rates.

Next, with the plasma gas and the processing gas supplied into the chamber 110, the stage 108 is moved to a position u, for instance, and subsequently, a microwave electromagnetic field is supplied to the radial antenna unit 102 via the microwave guiding channel 159. The electromagnetic field supplied to the radial antenna unit 102 is propagated radially from the central area of the conductor plates 151 and 153 of the radial line slot antenna toward the periphery and is radiated through the numerous slots 157 formed at the conductor plate 151.

The electromagnetic field with a high-frequency is transmitted through the dielectric plate 104 and is supplied into the chamber 110. The high-frequency electromagnetic field ionizes Ar by forming an electrical field in the chamber 110 and generates plasma in a space above the semiconductor wafer. Then, the stage 108 is moved to an optimal position, e.g., a position c, for the etching process and the semiconductor wafer undergoes the etching process.

In the plasma processing apparatus 100, the etching process is executed with ions drawn out of the plasma generated by applying a negative potential bias to the stage 108, which then collide into the surface of the semiconductor wafer.

Once the etching process is completed, the stage 108 is lowered back to the position d. Then, the electrostatic chuck is turned off. As the lifter pins 114 are pushed upward, the semiconductor wafer departs from the stage 108 and the semiconductor wafer, now unrestricted, is carried out of the chamber 110.

Figure 4:
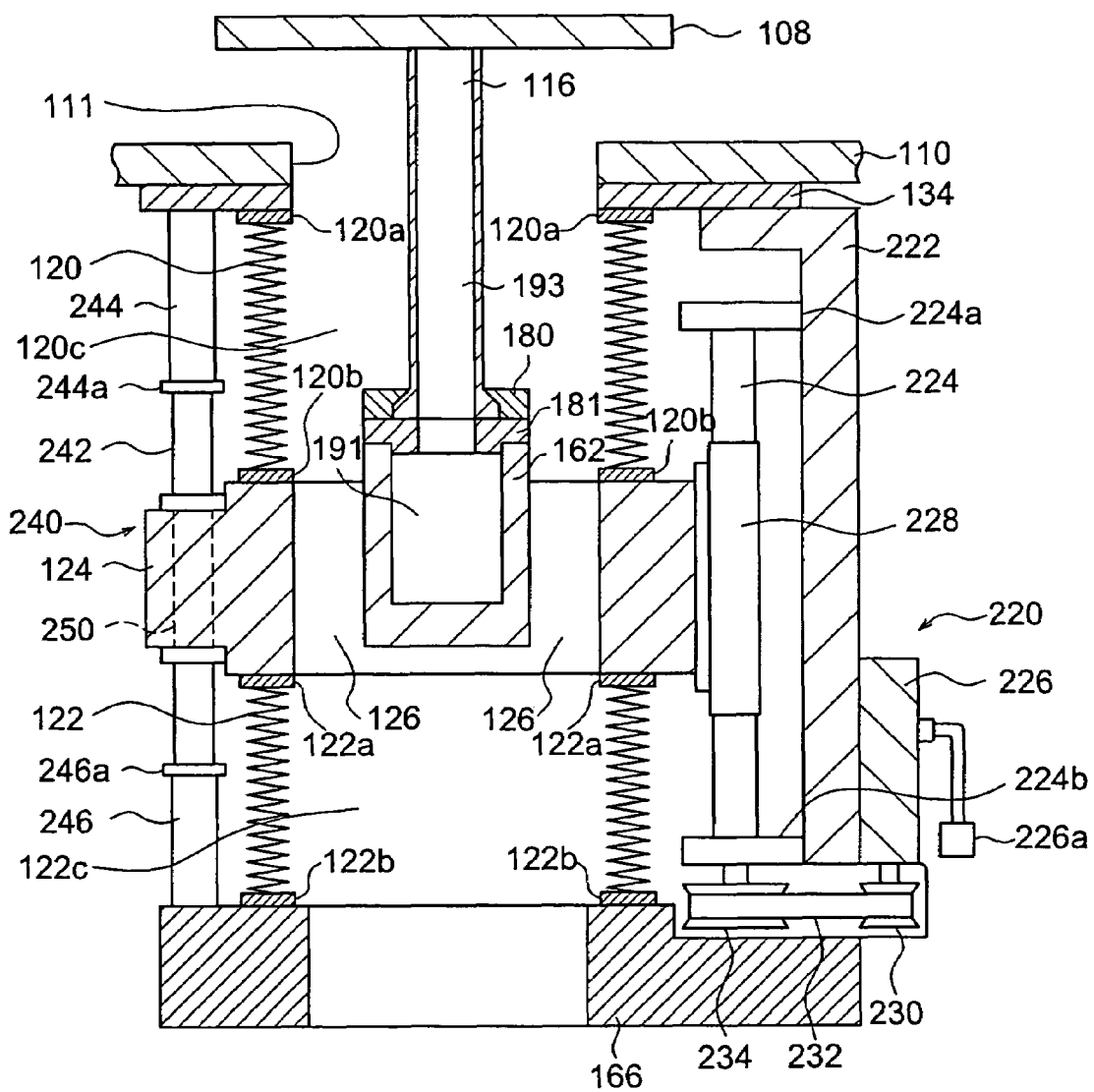
FIG. 4 is a sectional view of the stage drive mechanism.

Next, the structure adopted in the mechanism to drive the stage up/down is explained in reference to FIGS. 1 and 4. FIG. 4 is an enlargement of an area around the stage supporting unit shown in FIG. 1. As explained earlier, the stage 108 is supported by and moves together with the stage supporting unit 124. The stage supporting unit 124, in turn, is supported by the stage drive mechanism 220 and the slide support mechanism 240 which supports it at its other side surface.

First, the structure of the stage drive mechanism 220 is explained. Under the upper flange 134 at one end, a holding member 222 is disposed, and a linear rail 224 and a motor 226 are mounted at the holding member 222. The linear rail 224 is fixed so as to range along the vertical direction inside the holding member 222 via fixing members 224a and 224b. A guide member 228 is mounted at the linear rail 224 so that the guide member 228 is allowed to move along the linear rail 224. The side surface at an end of the stage supporting unit 124 is fixed to the guide member 228, and thus, the stage supporting unit 124 is allowed to move up/down along the linear rail 224 via the guide member 228. The linear rail 224 and the guide member 228 together may constitute a movement assisting member.

The motor 226 is disposed on the outside of the holding member 222. Power from a source (not shown) is supplied to the motor 226 via a power supply unit 226a. Under the motor 226, a pulley 230 is disposed. The pulley 230 disposed near the motor 226 is connected to a pulley 234 disposed toward the linear rail 224 via a belt 232. The conversion mechanism (not shown) which converts the rotational motion of the pulley 234 to a sliding motion of the guide member 228 is disposed inside the linear rail 224.

The conversion mechanism mentioned above may be constituted with a ball screw which is interlocked in a screw hole formed at, for instance, the guide member 228. In such a case, as the motor 226 is driven, the pulley 234 is caused to rotate via the pulley 230 and the belt 232 thereby causing the ball screw to rotate, which, in turn, causes the stage supporting unit 124 to move up/down along the linear rail 224 via the guide member 228 in a speedy and accurate manner.

Now, the slide support mechanism 240 is explained. A slide rod 242 is disposed between the lower surface of the upper flange 134 and the upper surface of the lower exhaustion flange 166. The slide rod 242 is fixed between an upper support rod 244 and a lower support rod 246 via stoppers 244a and 246a respectively. A through hole 250 at which the slide rod 242 is slidably inserted is formed at an end of the stage supporting unit 124. As this end portion slides along the slide rod 242, the stage supporting unit 124 is guided along the vertical direction.

It is to be noted that the slide support mechanism 240 should be disposed at an end of the stage supporting unit 124 opposite from the end of the stage supporting unit 124 at which the stage drive mechanism 220 is disposed. By assuming this positional arrangement, the stage 108 can be held in a horizontal state even more securely when the stage supporting unit 124 causes the stage 108 to move up/down, so as to achieve a smoother vertical movement. In addition, a plurality of slide support mechanisms 240 may be provided. Two slide support mechanisms 240 are provided in the embodiment, with FIGS. 1 and 4 showing one of them. By providing two such slide support mechanisms, the horizontal stability of the stage moving up/down is improved. The slide support mechanism 240 may constitute a movement assisting member as well.

As described above, the stage supporting unit 124 is supported at the two ends by the stage drive mechanism 220 and the slide support mechanism 240, and its lower portion is connected to and supported by the lower exhaustion flange 166. Thus, the stage 108 is held horizontally and steadily by the stage supporting unit 124 and the bellows 122 while the semiconductor wafer is processed, regardless of the particular position it assumes, the position u, c or d.

As explained in detail above, the plasma processing apparatus 100 achieved in the embodiment includes the bellows 122 disposed under the stage supporting unit 124 used to support the stage 108 so as to improve the stability of the stage supporting unit 124. Namely, it adopts a structure in which the bellows 120 and 122 with an airtight seal, hold the stage 108 horizontally and steadily and are also used for exhaustion.

Thus, the plasma processing apparatus 100 in the embodiment achieves an improvement over a plasma processing apparatus in the related art with no bellows 122, in which no hole is formed in the stage supporting block so as to achieve an airtight seal, the stage supporting block is held on only one side by a stage holding mechanism and the semiconductor wafer cannot be processed evenly due to a tilt caused by the air pressure applied from the outside when the degree of vacuum inside the chamber becomes high.

In addition, while it is sometimes necessary to fine-adjust the lifter pins 114 after the stage 108 becomes tilted, such adjustment is no longer required and thus, a higher degree of convenience in maintenance is achieved. Since the processing apparatus adopts a structure having an exhausted port at the center of the bottom of the chamber 110 within the chamber 110 to achieve uniform exhaustion of the chamber 110 through the bellows 120 and 122, the communicating holes 126 at the stage supporting unit 124 and the exhaust hole 171, the quality of the airtight seal, the stability of the vertical drive and the ease of maintenance can be improved effectively with the stage supported through the method according to the present intention.

It is to be noted that the stage supporting unit 124 is supported at its sides by the stage drive mechanism 220 and the slide support mechanism 240 and its upper portion and lower portion are connected to the bellows 120 and 122 respectively with an airtight seal.

SECOND EMBODIMENT

Figure 5:
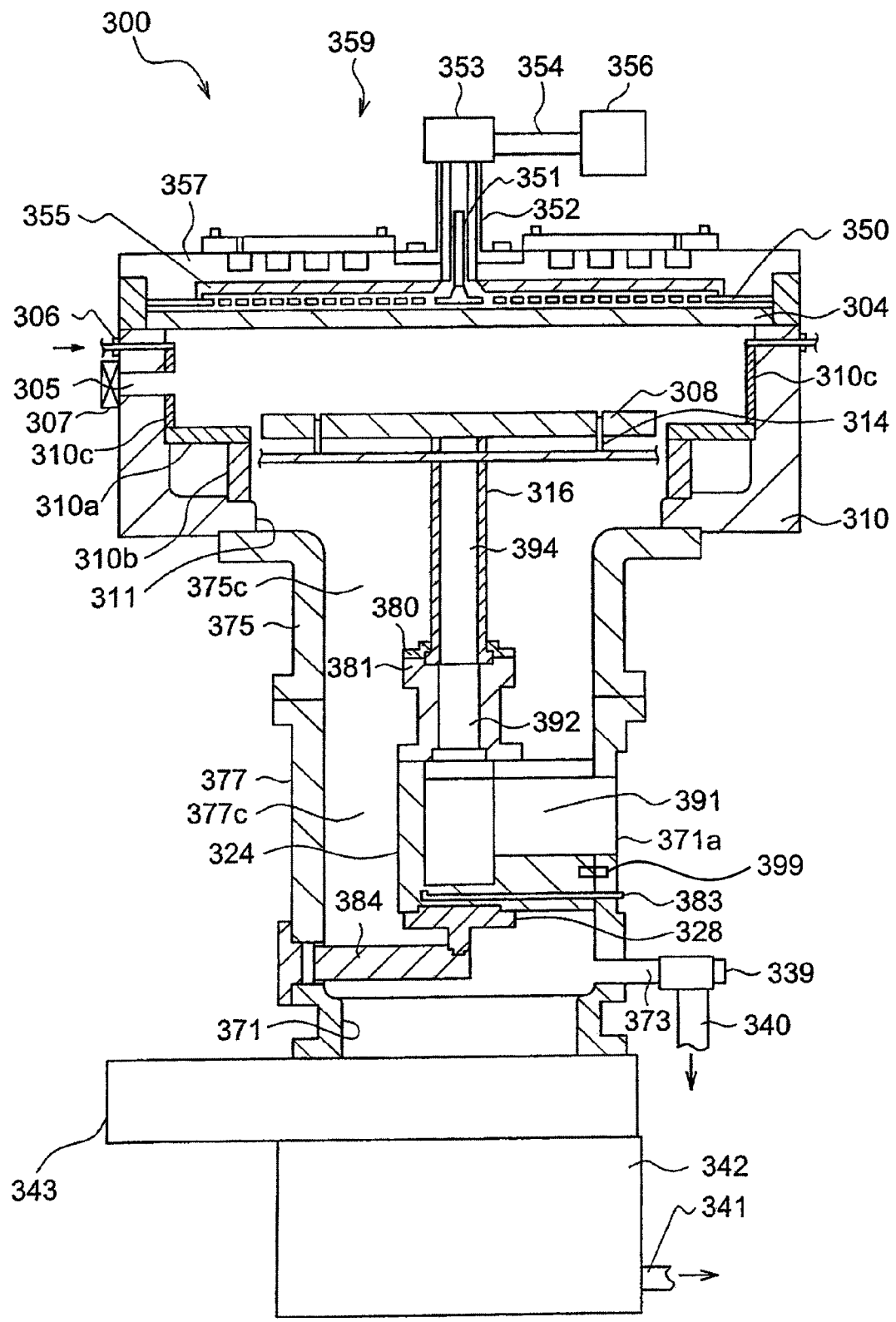
FIG. 5 is a schematic sectional view showing the structure adopted in the plasma processing apparatus achieved in a second embodiment of the present invention.
Figure 6:
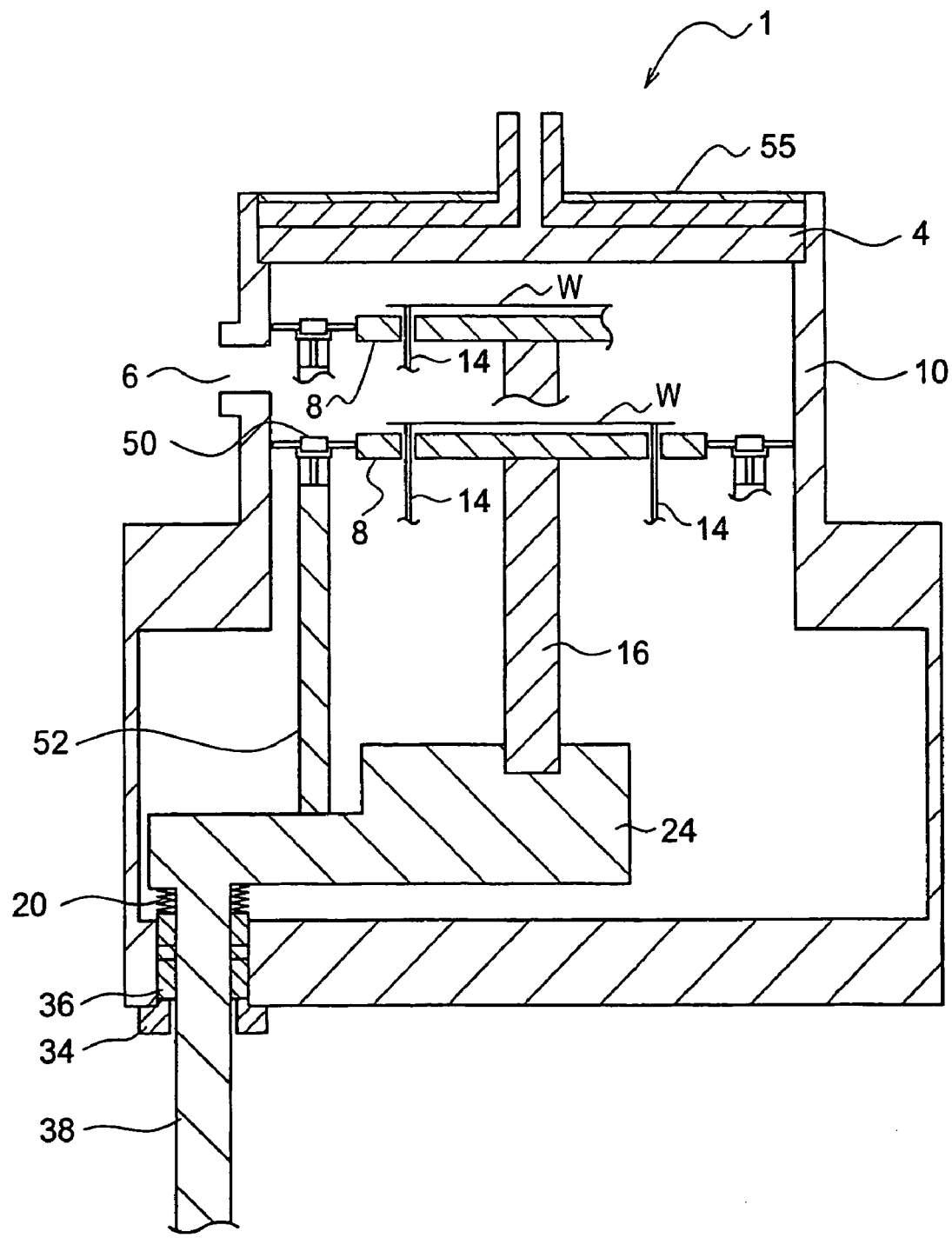
FIG. 6 is a schematic sectional view showing the structure of a plasma processing apparatus in the related art.

FIG. 5 is a schematic sectional view of the structure adopted in a plasma processing apparatus 300 in the second embodiment of the present invention. As shown in FIG. 5, the processing apparatus 300 includes a cylindrical chamber 310 with an open top. The chamber 310 is constituted with a conductive material, e.g., a metal such as aluminum or stainless steel, or an alloy thereof.

At the open top of the chamber 310, a flat dielectric plate 304 is horizontally disposed. The dielectric plate 304 may be constituted of quartz or ceramic and has a thickness of, for instance, approximately 20 to 30 mm. A seal member (not shown) which may be an O-ring is disposed between the chamber 310 and the dielectric plate 304 to maintain an airtight condition.

Above the dielectric plate 304, a radial antenna unit 359, which may be a type of slot antenna, is installed. The radial antenna unit 359 constituted with radial line slot antennas 350 is connected to a microwave generating source unit 356 via a waveguide 352, a microwave mode converter 353 and a rectangular waveguide 354. The microwave generating source unit 356 generates a microwave with a frequency within a range of 300 MHz to 30 GHz, e.g., 2.45 GHz. The top of the radial line slot antenna 350 is covered with a material 355 and above the material 355, a cooling plate 357 having a cooling jacket is disposed. Thus, the radial line slot antenna 350 and the dielectric plate 304 can be cooled with a high degree of efficiency. In addition, a matching circuit (not shown) that achieves impedance matching may be provided in the rectangular wave guiding channel to improve the efficiency of power use.

Inside the waveguide 352, a shaft portion 351 constituted of an electrically conductive material is connected to the center of the top surface of the radial line slot antenna 350. Thus, the waveguide 352 functions as a coaxial waveguide and an electromagnetic field with a high-frequency is radiated into the chamber 310 via the dielectric plate 304. The dielectric plate 304 isolates the radial line slot antenna 350 from the chamber 310 for protection from plasma exposure.

Under the chamber 310, flange pipes through which the chamber 310 is exhausted, e.g., flanges 375 and 377, are disposed with an airtight seal. The two flanges 375 and 377, which are hollow pipe-like members, are connected to each other along a substantially vertical direction. At an approximate center of the bottom of the chamber 310, an exhausting hole 311 through which the atmosphere inside the chamber 310 is discharged is formed. The upper end of the flange 375 is connected with an airtight seal to the lower surface of the chamber 310 so as to enclose the exhausting hole 311. The lower end of the flange 375 is connected with an airtight seal to the upper end of the flange 377, with an exhausting port 371 formed at the bottom of the flange 377.

In addition, a turbo pump 342 is connected to the lower portion of the flange 377 via a valve 343 which is connected to the exhausting port 371. The valve 343 may be constituted with, for instance, a high-back valve and a pressure control valve such as an APC valve.

At a side surface of the flange 377 toward its bottom, a rough suction exhaustion port 373 through which the chamber 310 is exhausted is formed. A vacuum pump (not shown) is connected with the rough suction exhaustion port 373 via a rough suction line 340 connected to the rough suction exhaustion port 373 via an electromagnetic valve 339, and an exhaustion line 341 of the turbo pump 342 is connected to the vacuum pump.

The desired degree of vacuum is achieved inside the chamber 310 by exhausting the chamber 310 via the rough suction line 340 and the turbo pump 342.

During exhaustion, hollow portions 375c and 377c of the flanges 375 and 377 constitute an exhausting passage through which the atmosphere inside the chamber 310 is evenly exhausted. More specifically, the hollow portion (exhausting passage) 375c in the flange 375 communicates with the space inside the chamber 310 (processing space). The hollow portion (exhausting passage) 377c in the flange 377 communicates with the hollow portion 375c in the flange 375 on its upper side and communicates with the exhausting port 371 and the rough suction exhaustion port 373 on its lower side. While a stage supporting unit 324 is disposed inside the flange 377, a uniformly formed specific passage 377c (hollow portions of the flanges 377) is present between the stage supporting unit 324 and the inner side surface of the flange 377 to enable exhaustion through the passage 377c.

As described above, the processing apparatus adopts an exhaustion structure in which the space inside the chamber 310 communicates with the exhausting port 371 or the rough suction exhaustion port 373 disposed further down via the exhausting hole 311 formed at an approximate center at the bottom of the chamber 310, the hollow portion 375c in the flange 375 and the hollow portion 377c in the flange 377. Thus, the chamber 310 can be evenly exhausted through the exhausting port 371 or the rough suction exhaustion port 373.

In addition, through a gas injectors 306 disposed at the sidewall of the chamber 310 toward the top of the chamber 310 and assuming a nozzle form or a shower head form with which a uniform supply is achieved, various types of processing gases and the like are supplied.

A stage 308, on which a workpiece such as a semiconductor wafer (not shown) is placed, is disposed inside the chamber 310. At the upper surface of the stage 308, an indented portion with a depth of, for instance, approximately 0.5 to 1 mm is formed so as to range slightly further outward relative to the periphery of the semiconductor wafer, and the semiconductor wafer placed inside the indented portion is not allowed to shift. It is to be noted that such an indented portion constituting a groove does not need to be formed if, for instance, an electrostatic chuck is provided since the semiconductor wafer is held with an electrostatic force imparted by the electrostatic chuck.

A heating resistor (not shown) is embedded inside the stage 308. The stage 308 is heated by applying power to the heating resistor so as to heat the wafer. The stage 308 is constituted of a ceramic such as AlN or $Al_2O_3$.

A lower electrode is embedded inside the stage 308. A high-frequency source (not shown) may be connected to the lower electrode via a matching box (not shown). In such a case, the high-frequency source may apply high-frequency power with a frequency set in the range of, for instance, 450 kHz to 13.65 MHz so as to apply a high-frequency bias, or a DC source may be connected so as to apply a continuous bias.

The stage supporting unit 324 supports the stage 308 via a support element 316 and the like. The stage supporting unit 324 is constituted of a mental such as Al or an Al alloy, whereas the stage support element 316 is constituted of a ceramic such as AlN. The stage 308 and the stage support element 316 are either constituted as an integrated unit or bonded to each other through brazing or the like, and for this reason, no vacuum seal or fixing screws are required. The lower portion of the stage support element 316 is supported at a insulation supporting portion 381 constituted of a metal such as Al or an Al alloy with a screw or the like via a fixing ring 380 constituted of a metal such as Al or an Al alloy, and thus, the gap between the stage surface of the stage 308 and the dielectric plate 304 can be adjusted. In addition, the stage support element 316 and the insulation supporting portion 381 are sealed with an airtight seal by using an O-ring or the like (not shown). The insulation supporting portion 381 is also fixed to the stage supporting unit 324 with an airtight seal via an O-ring or the like (not shown).

The stage supporting unit 324 is fixed to the side surface of the flange 377 by a first fixing portion 399, such as a screw or the like, with an airtight seal achieved by using an O-ring or the like. More specifically, a side of the stage supporting unit 324 is connected to the inner side surface of the flange 377. In addition, the stage supporting unit 324 is supported at its bottom by a fixing member 384 which also functions as a positioning member to horizontally position the stage 308 via the stage supporting unit 324 during an assembly after maintenance work. The fixing member 384 is inserted from the outside into a fixing hole formed at the flange 377 with an airtight seal and is fixed to the flange 377. At an end of the fixing member 384, the stage supporting unit 324 is mounted via a retaining member 328 disposed under the stage supporting unit 324 so as to horizontal the stage with ease.

As mentioned above, the fixing member 384 has the additional function as a positioning member. The stage 308 is positioned as the lower portion of the stage supporting unit 324 becomes engaged at an engaging portion provided at an end of the fixing member 384 via the retaining member 328. The engaging portion may be formed as an indented portion located at an end of the fixing member 384 on the upper side, as shown in FIG. 5, so that the lower portion of the stage supporting unit becomes engaged as a projecting portion formed at the lower portion of the retaining member 328 is inserted at the indented portion. In this structure, the retaining member 328 may be fixed at the engaging portion of the fixing member 384 with a screw or a bolt. In addition, although not shown, a hole may be formed at the end of the fixing member 384 to constitute an engaging portion of the positioning member and the lower portion of the stage supporting unit 324 may be inserted in this hole.

Inside the stage supporting unit 324, a space 391 opening toward the side wall of the flange 377 and an opening communicating with the stage supporting unit 324 are formed. The space 391 communicates with the atmosphere via an opening 371a located at the side surface of the flange 377. The space 391 also communicates with a space 394 inside the stage support element 316 via a space 392 in the insulation supporting portion 381 and the spaces are both open to the atmosphere.

In the space at the stage supporting unit 324, the wiring through which power is supplied to the heating resistor (not shown) in the stage 308 is supplied, the wiring of the thermocouple used to measure and control the temperature of the stage 308 and the like are disposed. It is to be noted that the contents such as the wirings mentioned above are identical to those indicated with the dotted lines in FIG. 2, and for this reason, their illustration is omitted in FIG. 5. These contents are led out to the outside of the plasma processing apparatus 300 through the opening 371a at the flange 375 via the space 394 inside the stage support element 316 and the space 391 in the stage supporting unit 324.

Furthermore, a cooling water passage 383 is formed inside the stage supporting unit 324 near its bottom so as to draw in cooling water from the outside of the plasma processing apparatus 300. The cooling water prevents an increase in the temperature of the stage supporting unit 324 caused by the heat of the stage 308 transferred via the stage support element 316.

As described above, the stage 308 is fixed to the flange 377 at a plurality of positions in the plasma processing apparatus 300. For instance, the stage 308 is fixed at two positions, i.e., at a side and at the bottom of the stage supporting unit 324 to which the stage 308 is attached, in the embodiment. The bottom of the stage supporting unit 324 is fixed to the flange 377 via the retaining member 328 and the fixing member 384. A side of the stage supporting unit 324 is fixed to the inner surface of the flange 377. Namely, with the stage supporting unit 324, which supports the stage 308, fixed to the flange 377 at two fixing positions, the stage 308 is fixed to the chamber 310. In addition, during maintenance work, the stage 308, the stage support element 316, the insulation supporting portion 381, the stage supporting unit 324 and the like, which are positioned as the projecting portion of the retaining member 328 is inserted at the indented portion formed at an end of the fixing member 384, can be mounted in a horizontal state with great ease.

It is to be noted that a baffle plate 310a constituted of a dielectric material such as quartz may be disposed inside the chamber 310 so as to enclose the stage 308 for contamination (pollution) prevention. The baffle plate 310a is supported by a baffle plate support member 310b. In addition, a liner 310c may be disposed on the inner wall of the chamber 310 so as to protect the inner wall against contamination and the like. By shielding the chamber 310 with a shield plate as described above, it becomes possible to create a clean environment.

Next, as an example of a film formation processing operation that may be executed in the plasma processing apparatus 300 achieved in the embodiment, the formation of a gate oxide film in an MIS semiconductor device, through which an $SiO_2$ film, an SiON film or an SiN film, for instance, is formed on a wafer, is explained. Since the distance between the dielectric plate 304 and the stage 308 is fixed in advance in the plasma processing apparatus 300, a gate valve 307 is first opened to transfer a semiconductor wafer to a position above the stage 308 through a wafer transfer port 305. A clean Si surface will have been formed at the semiconductor wafer with a diluted hydrofluoric acid solution (HF content; 1%) or the like. After the semiconductor wafer is carried in, the lifter pins 314 are lowered to set the semiconductor wafer onto the stage 308.

Next, the plasma processing apparatus 300 is exhausted first through the rough suction line 340. Once a specific degree of vacuum is achieved, the turbo pump 342 is used to exhaust the chamber 310 to a predetermined degree of vacuum, e.g., 1 to 133.3 Pa. While holding this degree of vacuum, a processing gas is supplied through the gas injector 306 by controlling the flow rate.

Next, with the chamber 310 charged with the plasma gas and the processing gas, a high-frequency electromagnetic field with a frequency of, for instance, 2.45 GHz, is supplied to the radial line slot antenna 350 from the microwave generating source unit 356 via the wave guiding channel 359. This high-frequency electromagnetic field is transmitted in a rectangular mode through the rectangular waveguide 354, the rectangular mode is switched to a circular mode at the microwave mode converter 353, the electromagnetic field is thus transmitted in the circular mode through the coaxial circular waveguide 352 and the electromagnetic field is then radiated through the slots at the radial line slot antenna 350. The high-frequency electromagnetic field is transmitted through the dielectric plate 304 to enter the chamber 310 and forms an electrical field in the chamber 310 which induces ionization of the processing gas. As a result, plasma is generated in the space above the semiconductor wafer to be used to execute a specific type of processing on the semiconductor wafer.

When directly forming an insulating film (an SiON film) on an Si substrate, the temperature of the semiconductor wafer is raised to, for instance, 400° C. by heating the stage 308. In this state, a processing gas constituted with, for instance, Xe gas/$N_2$ gas/$H_2$ gas/$O_2$ gas is supplied at a flow rate ratio of 500 sccm/25 sccm/15 sccm/1 sccm (=Xe gas/$N_2$ gas/$H_2$ gas/$O_2$ gas) through the gas injector 306. It is to be noted that the processing gas described above may contain Ar gas instead of Xe gas. An SiON film is formed on the Si substrate through oxidation/nitridation processing executed with plasma formed from the processing gas. It is to be noted that a processing gas that does not contain $N_2$ gas should be used to form an $SiO_2$ film. In addition, a processing gas that does not contain $O_2$ gas should be used to form an SiN film.

Upon completing such film formation processing, the lifter pins 314 are pushed up, thereby lifting the semiconductor wafer having been held onto the stage 308 with the electrostatic chuck or the like and the semiconductor wafer thus allowed to move away from the stage 308 is carried out through the wafer transfer port 305.

During the film formation processing operation described above, the stage supporting unit 324 supporting the stage 308 remains positioned and supported with the projecting portion of the retaining member 328 fitted at the indented portion formed at an end of the fixing member 384. In addition, the stage 308 is fixed to the flange 377 located under the chamber 310 by the stage supporting unit 324 and thus, the stage 308 does not become tilted.

As explained in detail above, the stage supporting unit 324 used to support the stage 308 is fixed to the chamber 310 and the like with the flanges 375 and 377 and the fixing member 384 in the plasma processing apparatus 300 achieved in the embodiment, and thus, a structure that improves the stability of the stage supporting unit 324 and the stage 308 is achieved.

Consequently, the problem of plasma processing apparatuses in the related art, i.e., semiconductor wafers cannot be processed uniformly due to a tilt of the stage, is corrected and the stage can be held horizontal. In addition, while it is sometimes necessary in the related art to fine-adjust the lifter pins used to aid the placement of a semiconductor wafer onto the stage 308, such adjustment is not required and thus, the ease of maintenance is improved.

As explained above, according to the present invention which includes bellows disposed above and below the block used to support the stage, the workpiece stage can be held steadily regardless of the specific degree of vacuum achieved in the processing chamber and, as a result, a processing apparatus affording great ease of maintenance since frequent fine-adjustment is not required and capable of uniform and stable plasma processing is provided.

The present invention may be adopted in a processing apparatus and more specifically, it may be adopted in a processing apparatus having a stage on which a workpiece is placed.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiments on examples in which the processing apparatus according to the present invention is embodied as an etching apparatus and a film forming apparatus, the present invention is not limited to these examples and may be adopted in any processing apparatus that processes a workpiece by achieving a predetermined degree of vacuum inside the processing container and includes a workpiece stage disposed so as to move up/down freely. For instance, the present invention may be adopted in any of various types of vacuum processing apparatuses including plane parallel plasma processing apparatuses, helicon wave plasma processing apparatuses and inductively coupled plasma processing apparatuses.

In addition, the present invention may be adopted in plasma processing apparatuses used to manufacture substrates for liquid crystal display devices, as well as in plasma processing apparatuses employed in semiconductor device production. It is within the scope of the present invention to use bellows assuming a rectangular tube shape if the processing container is formed in a rectangular tube shape in conformance to the shape of workpieces processed in a plasma processing apparatus employed in liquid crystal display device substrate production. The present invention will prove particularly effective when adopted in a vacuum processing apparatus having a stage on which the workpiece is placed or in a processing apparatus which is exhausted at the center thereof.

What is claimed is:

1. A processing apparatus used to execute a specific type of processing on a workpiece inside a processing container, comprising:
    a stage on which the workpiece is placed;
    a stage support element that supports the stage, the stage support element having a first space formed inside the stage support element;
    a flange pipe disposed under the processing container and used to exhaust the processing container;
    a stage supporting unit that supports a lower portion of the stage support element, the stage supporting unit further comprising a second space formed inside the stage supporting unit, the second space opening toward an opening formed at a side wall of the flange pipe, and the second space communicating with the first space and atmosphere via the opening formed at the side wall of the flange pipe;
    a first fixing portion that non-rotatably fixes a side of the stage supporting unit to a first inner side surface of the flange pipe;
    a second fixing portion that non-rotatably fixes a bottom of the stage supporting unit to a second inner side surface of the flange pipe;
    wherein the second fixing portion includes a fixing member connected to the bottom of the stage supporting unit via a non-rotatable retaining member disposed at the bottom of the stage supporting unit, the fixing member being fixed to the second inner side surface of the flange pipe, the fixing member being removably attached to the retaining member,
    wherein the fixing member is configured to horizontally position the stage via the stage supporting unit by fixing the bottom of the stage supporting unit during an assembly of at least the stage and the stage supporting unit, and
    wherein the first fixing portion fixes the side of the stage supporting unit positioned by the fixing member during the assembly near the opening formed at the side wall of the flange pipe.

2. A processing apparatus according to claim 1, further comprising:
    a hollow portion formed between the stage supporting unit and the second inner side surface of the flange pipe for exhausting the processing container.

3. A processing apparatus according to claim 1, wherein the flange pipe includes two flange pipes, at least one of the two flange pipes including an exhausting port.

4. A processing apparatus according to claim 1, wherein the stage supporting unit defines a cooling water passage configured to draw cooling water from outside the processing apparatus.

5. A processing apparatus according to claim 1, wherein the retaining member includes a projection and the fixing member includes a groove configured to receive the projection.

6. The processing apparatus according to claim 1, wherein the retaining member is disposed entirely below the stage supporting unit, and
    wherein the fixing member is connected to a bottom surface of the retaining member.

7. A processing apparatus according to claim 1, further comprising:
    a dielectric plate disposed at an upper portion of the processing container; and
    a radial slot antenna disposed above the dielectric plate and used to generate plasma,
    wherein a microwave generating source is connected to the radial slot antenna.

8. A processing apparatus, comprising:
    a processing container for processing on a workpiece;
    a stage on which the workpiece is placed;
    a flange pipe disposed under the processing container and used to exhaust the processing container;
    a stage support element that supports the stage, the stage support element having a first space formed inside the stage support element;
    a stage supporting unit that supports a lower portion of the stage support element, the stage supporting unit further comprising a second space formed inside the stage supporting unit, the second space opening toward an opening formed at a side wall of the flange pipe, and the second space communicating with the first space and atmosphere via the opening of the flange pipe; and
    a retaining member disposed at a bottom surface of the stage supporting unit for horizontally positioning the stage;
    wherein a first fixing portion fixes a side of the stage supporting unit to a first inner side surface of the flange pipe,
    wherein a second fixing portion fixes the retaining member to a second inner side surface of the flange pipe via a fixing member disposed under the retaining member,
    wherein the fixing member is fixed to the second inner side surface of the flange pipe and removably attached to the retaining member in order to horizontally position the stage via the retaining member and the stage supporting unit, and wherein the first fixing portion fixes the side of the stage supporting unit to the first inner side surface of the flange pipe near the opening formed at the side wall of the flange pipe.

9. A processing apparatus according to claim 8, further comprising:

a hollow portion formed between the stage supporting unit and the second inner side surface of the flange pipe for exhausting the processing container.

10. A processing apparatus according to claim 8, wherein the flange pipe includes two flange pipes, at least one of the two flange pipes including an exhausting port.

11. A processing apparatus according to claim 8, wherein the retaining member includes a projection and the fixing member includes a groove configured to receive the projection.

* * * * *